(12) United States Patent
Gillespie et al.

(10) Patent No.: US 6,323,417 B1
(45) Date of Patent: Nov. 27, 2001

(54) METHOD OF MAKING I-III-VI SEMICONDUCTOR MATERIALS FOR USE IN PHOTOVOLTAIC CELLS

(75) Inventors: Timothy J. Gillespie; Craig H. Marshall; Bruce R. Lanning, all of Littleton, CO (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/407,388

(22) Filed: Sep. 28, 1999

Related U.S. Application Data
(60) Provisional application No. 60/102,296, filed on Sep. 29, 1998.

(51) Int. Cl.$^7$ ..................................... H01L 31/00
(52) U.S. Cl. ................. 136/262; 136/264; 136/265; 204/192.25; 204/192.26
(58) Field of Search .................. 136/262, 264, 136/265; 204/192.25, 192.26

(56) References Cited

U.S. PATENT DOCUMENTS

| | | | |
|---|---|---|---|
| 4,128,733 | 12/1978 | Fraas et al. | 136/89 |
| 4,465,575 | 8/1984 | Love et al. | 204/192 |
| 4,571,447 | 2/1986 | Prins | 136/252 |
| 4,581,108 | 4/1986 | Kapur et al. | 204/37.1 |
| 4,638,111 | 1/1987 | Gay | 136/249 |
| 4,680,422 | 7/1987 | Stanbery | 136/249 |
| 4,684,761 | 8/1987 | Devaney | 136/258 |
| 4,703,131 | 10/1987 | Dursch | 136/258 |
| 4,915,745 | 4/1990 | Pollock et al. | 136/265 |
| 4,940,604 | 7/1990 | Suyama et al. | 427/76 |
| 5,045,409 | 9/1991 | Eberspacher et al. | 428/620 |
| 5,151,385 | 9/1992 | Yamamoto et al. | 437/181 |
| 5,356,839 | * 10/1994 | Tuttle et al. | 136/265 |
| 5,436,204 | 7/1995 | Albin et al. | 437/225 |
| 5,523,022 | 6/1996 | Morita | 252/518 |
| 5,728,231 | 3/1998 | Negami et al. | 148/33 |
| 5,730,852 | 3/1998 | Bhattacharya et al. | 205/192 |
| 5,769,964 | 6/1998 | Charache et al. | 136/262 |

* cited by examiner

Primary Examiner—Mark Chapman
(74) Attorney, Agent, or Firm—Swidler Berlin Shereff Friedman, LLP

(57) ABSTRACT

Provided is a method for making layers of I–III–VI semiconductor materials for use in photovoltaic cells, and particularly for making CIS and variations on CIS, such as CIGS and CIGSS. The method includes formation of a plurality of precursor films of the elemental components and at least one final heat treatment step in which the final semiconductor material is formed, with the precursor film for at least one III component being deposited prior to any precursor film including the I component.

56 Claims, 6 Drawing Sheets

METHOD OF MAKING I-III-VI SEMICONDUCTOR MATERIALS FOR USE IN PHOTOVOLTAIC CELLS

CROSS-REFERENCE TO RELATED APPLICATIONS

This application claims priority under 35 U.S.C. §119 to prior U.S. Provisional Patent Application No. 60/102,296 filed Sep. 29, 1998, the entire contents of which are incorporated herein by reference as if set forth in full at this location.

ACKNOWLEDGEMENT OF GOVERNMENT SUPPORT

This invention was made with Government support under Agreement No. MDA 972-95-3-0036 awarded by ARPA. The Government has certain rights in the invention.

FIELD OF THE INVENTION

The present invention involves manufacture of I–III–VI semiconductor materials for use in photovoltaic cells, the semiconductor materials manufactured by the method, and photovoltaic devices incorporating the semiconductor materials. In a significant aspect, the present invention is directed toward the manufacture of semiconductors of CIS and variations of CIS, such as CIGS and CIGSS.

BACKGROUND OF THE INVENTION

I–III–VI compound semiconductor materials have received significant attention for use in photovoltaic cells because of the desirable band gap provided by many of those materials. Several photovoltaic cell designs have been proposed using such semiconductors, with a common cell design incorporating a p-type layer of the I–III–VI semiconductor material forming a heterojunction with an n-type semiconductor material, such as cadmium sulfide or cadmium zinc sulfide.

A number of different I–III–VI semiconductor materials have been proposed for use in photovoltaic cells. Some examples include $AgInS_2$, $AgGaSe_2$, $AgGaTe_2$, $AgInSe_2$, $AgInTe_2$, $CuGaS_2$, $CuInS_2$, $CuInTe_2$, $CuAlS_2$, and $CuGaSe_2$. Most attention, however, has been focused on copper indium diselenide ($CuInSe_2$) and variations of copper indium diselenide in which a portion of the indium is replaced with one or more of aluminum and gallium and/or a portion of the selenium is replaced with sulfur and/or tellurium. Copper indium diselenide is commonly referred to as "CIS." Two promising variations of CIS that have been proposed include $CuIn_xGa_{1-x}Se_2$ (commonly referred to as "CIGS") and $CuIn_xGa_{1-x}Se_yS_{2-y}$ (commonly referred to as "CIGSS"). These and other I–III–VI semiconductors may be manufactured for use in photovoltaic cells according to the present invention.

A variety of techniques have been proposed for fabricating various I–III–VI semiconductor materials for use in photovoltaic cells. One technique is to coevaporate all of the I, III and VI components and then react the components to form the desired semiconductor material. This technique has been used to produce small-area photovoltaic cells with very high efficiencies, in excess of 15%, but the technique is complex. Simultaneous deposition from a number of sources is difficult to control, and scale-up for a commercial operation is a significant problem.

Another technique is to sequentially deposit precursors for the desired semiconductor material and then heat the deposited precursors to form the desired semiconductor material. Relative to coevaporation, sequential deposition is less complex and easier to control and is, therefore, easier to scale up for a commercial operation. A significant problem with sequential deposition techniques, however, is that resulting photovoltaic cells tend to have relatively low efficiencies.

One variation on the sequential deposition technique for making CIS involves "selenization" of predeposited copper and indium films to form the final semiconductor material. This selenization is accomplished by reacting the metal precursors with a reactive selenium-containing gas, typically hydrogen selenide. Although the selenization process has resulted in somewhat improved photovoltaic cell efficiencies, hydrogen selenide is a very hazardous gas, which makes operation of the process problematic.

Another significant problem with all of the fabrication techniques, and especially with sequential deposition techniques, is a lack of good adhesion of the I–III–VI semiconductor material to adjoining layers, and especially to a molybdenum film often used as a back contact for CIS photovoltaic devices. Without good adhesion, delaminations can occur which significantly impair the performance and reliability of the photovoltaic cells.

A need exists for new techniques to fabricate I–III–VI semiconductors for use in photovoltaic cells, and especially for fabrication techniques that are easily scaled up for use in a commercial operation, that permit the manufacture of photovoltaic cells having reasonably high efficiencies, that avoid the use of highly hazardous gases and that promote good adhesion of the semiconductor material to adjoining layers.

SUMMARY OF THE INVENTION

It is an object of the present invention to provide a method for making I–III–VI semiconductor materials for use in photovoltaic modules in a manner that is less complex from a control standpoint than coevaporation techniques. It is another object of the present invention to provide a method for making I–III–VI semiconductor layers that is scalable for manufacture of large-area films. It is another object of the present invention to provide a method for making I–III–VI semiconductor materials in a manner to promote good adhesion of the semiconductor layer for use in photovoltaic cells. It is a further object of the present invention to provide a method for making I–III–VI semiconductor materials which can be incorporated into photovoltaic cells to provide relatively high cell efficiencies. It is yet another object of the present invention to provide a method for making I–III–VI semiconductor materials which avoids the use of highly hazardous hydrogen selenide gas.

These and other objects are addressed by the method of the present invention through a sequential deposition process for making a layer of I–III–VI semiconductor material for use in photovoltaic cells, with the method involving sequential deposition of components, with at least one III component, typically in elemental form, being deposited prior to deposition of a I component, which is also typically in elemental form. Following the sequential deposition, the I–III–VI semiconductor material is formed, incorporating the previously deposited III and I components. In one preferred embodiment of the method, a III component is converted from elemental form to a compound form, in the form of a chalcogenide compound including the III component, prior to deposition of a I component. The conversion of the III component from elemental form to a compound form may effectively be accomplished through an initial heat treatment prior to deposition of a I component. Following deposition of the I component, the final semiconductor material may then be formed in a final heat treatment step. The method, therefore, typically includes at least two heat treatments. A VI component is often provided during the final heat treatment as a predeposited film of an elemental VI component. Also, or alternatively, a VI component, typically in elemental form, may be supplied during the final heat treatment, and/or during the initial heat treatment, as a vapor.

To convert the III components from elemental form to compound form in a chalcogenide compound, a chalcogen, or VI component, must be present during the initial heat treatment. According to the present invention, the chalcogen may be effectively supplied during the initial heat treatment in the form of one or more films of the desired elemental chalcogen that have been separately deposited, prior to the initial heat treatment, adjacent to the film of the elemental component. The present invention, therefore, typically involves the deposition of a sequence of films, typically including only elemental components, prior to the initial heat treatment. Also, or alternatively, a VI component, typically in elemental form, may be supplied during the initial heat treatment in vapor form.

In one preferred embodiment, after the initial heat treatment and prior to the final heat treatment, additional precursor films are sequentially deposited to facilitate formation of the final desired semiconductor material. These additional films typically include at least a film with a I component, typically in elemental form. These additional films may also include one or more films with a VI component, typically also in elemental form, and/or one or more films with a III component, typically also in elemental form. Intermediate processing between the initial heat treatment and the final heat treatment may include one or more additional heat treatment steps.

Preferred I–III–VI semiconductor materials for manufacture with the present invention include at least copper as a I component and indium as a III component, such as is the case with CIS, CIGS and CIGSS. As one example for manufacture of CIS, a sequence of precursor films are deposited for support on a substrate and processed to form the final semiconductor material. A first precursor film sequence is deposited including at least one film of elemental indium and at least one film of elemental selenium. This first precursor film sequence is then subjected to an initial heat treatment to convert at least a portion of the elemental indium to an $In_xSe_y$ chalcogenide compound. The initial heat treatment, therefore, accomplishes an initial selenization of the indium. A significant advantage of the initial heat treatment is that it promotes good adhesion to the substrate. Following the initial heat treatment, a film of elemental copper is formed to overlie the heat treated first sequence of films. The stack of films is then subjected to a final heat treatment to form the CIS semiconductor material. The final heat treatment is preferably performed in the presence of selenium vapor, such as may be provided by evaporation or sputtering, to assist in forming the CIS, and preferably with a film of selenium predeposited over the copper film prior to the heat treatment. The final heat treatment, therefore, accomplishes a final selenization to form the CIS. As one alternative, the film of elemental copper may be subjected to a separate, typically mild, heat treatment prior to the final heat treatment.

One example of manufacture of CIGS according to the present invention is to deposit a first sequence of films followed by an initial heat treatment. The first sequence of films could include a film of elemental gallium, a film of elemental indium and a film of elemental selenium. During the initial heat treatment, at least a portion of the indium and/or the gallium is converted from elemental to compound form in a chalcogenide compound. Processing could then be completed as previously described for CIS, although several different variations are possible.

One alternative for making indium-containing I–III–VI semiconductors, such as CIS, CIGS and CIGSS, with the present invention is to form a phase including $In_2Se_3$ prior to deposition of a I component, typically copper. The $In_2Se_3$ is preferably formed in an initial heat treatment as noted above. In one embodiment, however, $In_2Se_3$ could be deposited directly, in which case the initial heat treatment would not be necessary. Direct deposition of $In_2Se_3$ could, for example, be accomplished by sputtering from an $In_2Se_3$ target.

With the present invention, it has been found that adhesion of the I–III–VI semiconductor material is improved when the III component is deposited prior to the I component. This is contrary to the traditional practice in sequential deposition, which has been to deposit the I component first. Furthermore, the preferred initial heat treatment of the III component to form a chalcogenide compound promotes the manufacture of I–III–VI semiconductor materials of relatively high efficiency when used in photovoltaic cells. Furthermore, because all of the I, III and VI components may be sequentially deposited in elemental form, process control is significantly simplified relative to simultaneous deposition techniques. Moreover, the deposition equipment may be simplified relative to other processes, because with the sequential deposition process of the present invention, low temperature deposition of the films is possible. Furthermore, the I and III and IV components may typically be deposited by sputtering, which is preferable to vacuum evaporation deposition techniques used in simultaneous deposition processes. With the present invention, the use of hydrogen selenide may also be avoided.

DETAILED DESCRIPTION

Figure 1:
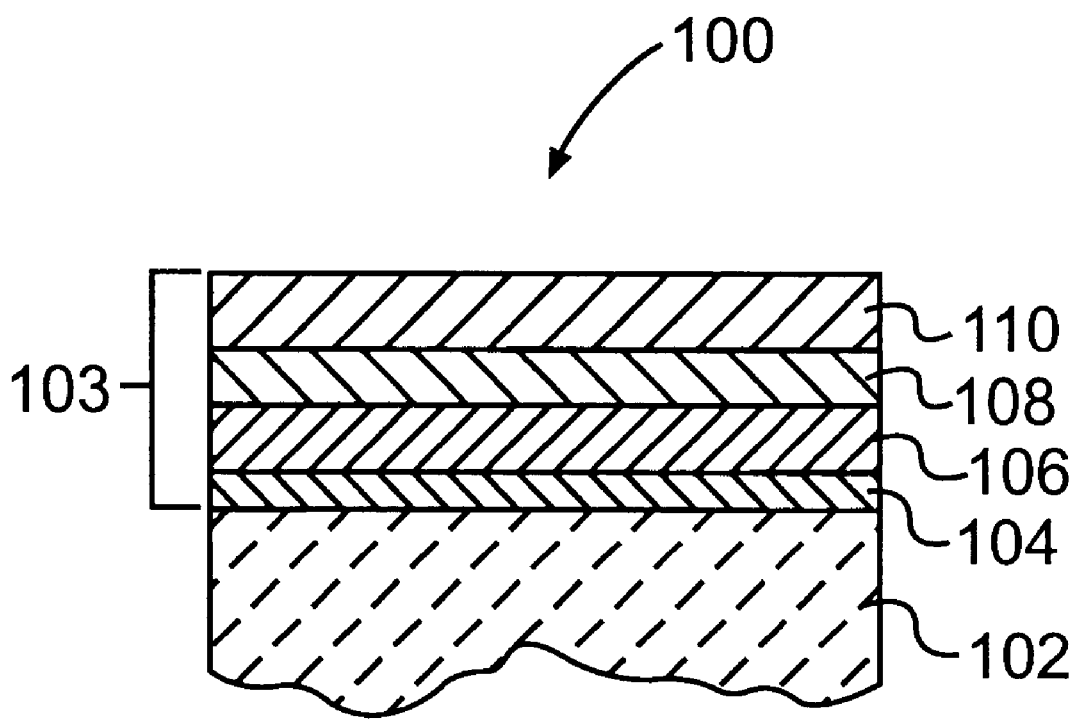
FIG. 1 is a partial cross-section of one design of a photovoltaic cell that may incorporate a I–III–VI semiconductor layer manufacturable according to the present invention.

FIG. 1 shows a partial cross-section of one example of a photovoltaic device incorporating a I–III–VI semiconductor layer manufacturable according to the present invention. As seen in FIG. 1, the photovoltaic device 100 includes a base substrate 102 on which a photovoltaic cell 103 is supported. The photovoltaic cell 103 includes a back contact layer 104, a p-type I–III–VI semiconductor layer 106, an n-type semiconductor layer 108 and a front contact layer 110. The photovoltaic cell 103, as shown in FIG. 1, is referred to as a heterojunction cell because of the presence of a power-producing heterojunction between the p-type I–III–VI semiconductor layer 106 and the n-type semiconductor layer 108.

With continued reference to FIG. 1, the base substrate 102 may be any suitable support structure for supporting the photovoltaic cell 103. The base substrate 102 may be rigid or flexible. This base substrate 102 is typically made of a dielectric material, but in some instances an electrically conductive base substrate 102 may be used. An example of a rigid dielectric base substrate 102 would be a sheet of soda lime glass. An example of a flexible dielectric base substrate 102 would be a flexible polyimide film. An example of an electrically conductive base substrate 102 would be a sheet of stainless steel, which could be rigid or could be in the form of a flexible foil. Other materials for use as the base substrate 102 are known in the art. The back contact layer 104 is made of a suitable electrically conductive material. A preferred material for the back contact layer 104 is molybdenum, although many other electrically conductive materials could be used. The p-type I–III–VI semiconductor layer 106 is manufacturable according to the method of the present invention as described hereinbelow. Examples of the p-type I–III–VI semiconductor layer 106 include CIS, CIGS and CIGSS. The n-type semiconductor layer 108 may be any suitable heterojunction partner for the p-type I–III–VI semiconductor layer 106. Examples of n-type semiconductor materials for the n-type semiconductor layer 108 include CdS and $Cd_xZn_{1-x}S$. The front contact layer 110 includes a transparent electrically conductive material, such as a transparent conducting oxide. Examples of transparent conducting oxides for use as the front contact layer 110 include zinc oxide and indium tin oxide. Also, the front contact layer 110 is often comprised of multiple films. For example, the front contact layer 110 may include a film of zinc oxide followed by a film of indium tin oxide for enhanced lateral conductivity. Also, the zinc oxide may be comprised of a highly resistive portion adjoining the n-type semiconductor layer and a more conductive portion opposite the n-type semiconductor.

Manufacture of the photovoltaic device 100 shown in FIG. 1 is usually accomplished by first depositing the back contact layer 104 on the base substrate 102, followed in sequence by formation of the p-type I–III–VI semiconductor layer 106, the n-type semiconductor layer 108 and then the front contact layer 110.

With the exception of the I–III–VI semiconductor layer 106, which is made according to the method of the present invention, the other layers in the photovoltaic cell 103 may be formed using any suitable technique, as is known in the art. The photovoltaic cell 103 shown in FIG. 1 is only one example of a photovoltaic cell structure in which the I–II-I–VI semiconductor material made according to the present invention may be incorporated. For example, if desired, the I–III–VI semiconductor material may be made as an n-type material or an intrinsic material, if desired. Also, the I–II-I–VI semiconductor may be made with varying semiconductor properties.

The present invention includes a method of making a layer of I–III–VI semiconductor material for use in a photovoltaic cell and the method for making a photovoltaic device including the I–III–VI semiconductor layer, as well as the semiconductor layers and the photovoltaic devices made according to the methods of the present invention.

For purposes of the present invention, a I–III–VI semiconductor material is a semiconductor material including one or more I component selected from the group consisting of copper (Cu) and silver (Ag); one or more III component selected from the group consisting of aluminum (Al), gallium (Ga) and indium (In); and one or more VI component selected from the group consisting of sulfur (S), selenium (Se), and tellurium (Te). The most commonly used I component is copper, the most commonly used III components are indium and gallium, and the most commonly used VI components are sulfur and selenium. Preferred I–III–VI semiconductor materials for manufacture by the method of the present invention include at least copper and indium, and preferably also selenium. Furthermore, it should be recognized that a semiconductor material is not outside of the scope of the present invention simply because it may include components other than the listed I, III and VI components. For example, the material may include extrinsic dopant materials or other components added to modify or tailor semiconductor properties for a particular purpose. For example, sodium may be added through the use of a sodium-doped selenium sputter target.

Figure 2:
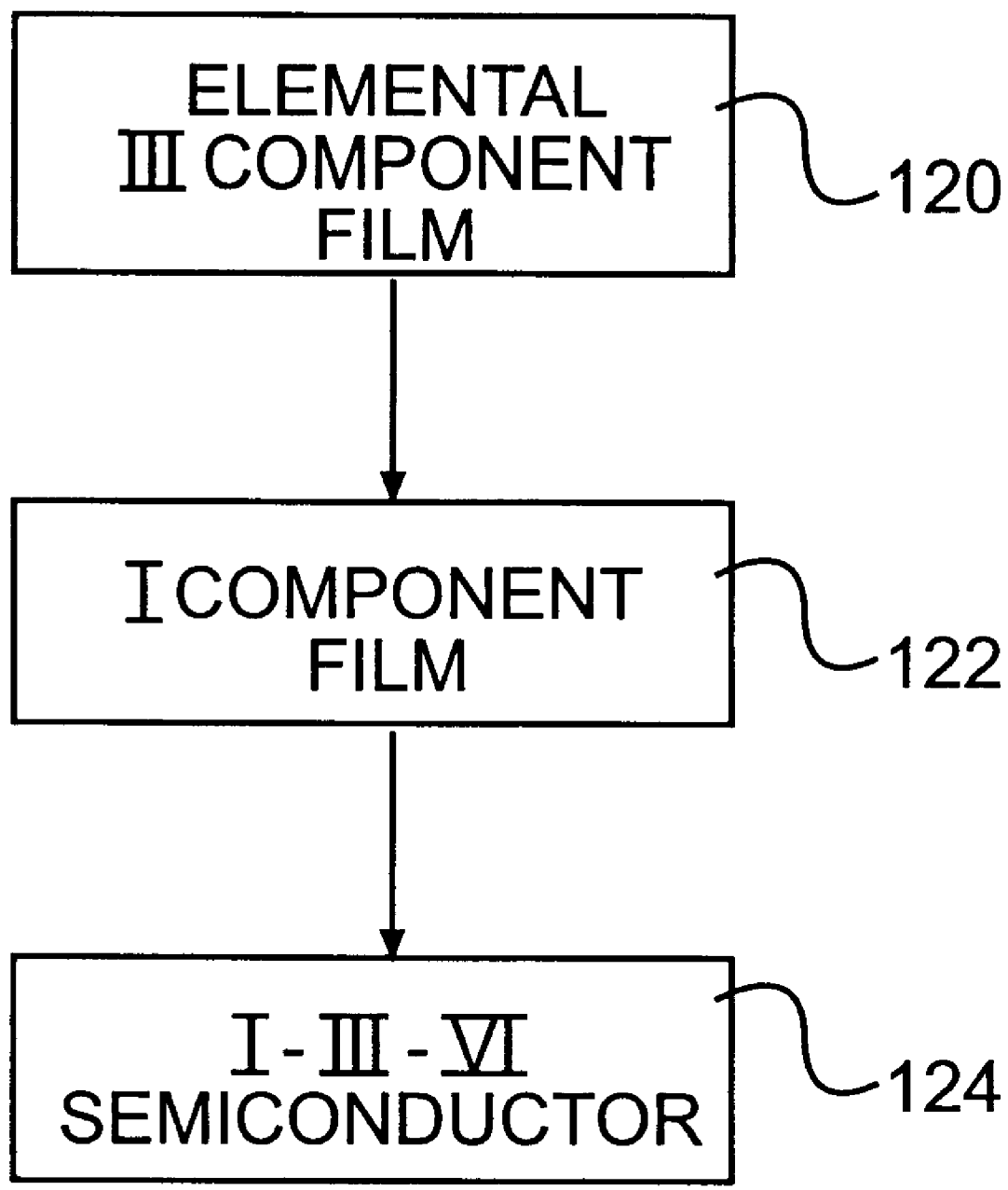
FIG. 2 is a process flow diagram showing generalized steps for one embodiment of the method of the present invention.

As noted, the method of the present invention is a sequential deposition method. Referring now to FIG. 2, a generalized process flow diagram is shown for one embodiment of the method for making a layer of I–III–VI semiconductor material. In a first step 120, a precursor film is formed of an elemental III component, so as to be supported by a base substrate, typically overlying a back contact layer already on base substrate. In a second general step 122, a precursor film is formed including a I component, which is also typically in elemental form. In a third general step 124, the desired I–III–VI semiconductor material is formed incorporating the III component and the I component.

In a preferred embodiment, an initial heat treatment occurs between the first step 120 and the second step 122. In a preferred operation of the initial heat treatment, at least a portion of the III component in the elemental precursor film is converted from elemental form to a compound form in a compound intermediate, which is typically a chalcogen intermediate. This embodiment is shown in the generalized process flow diagram shown in FIG. 3.

Figure 3:
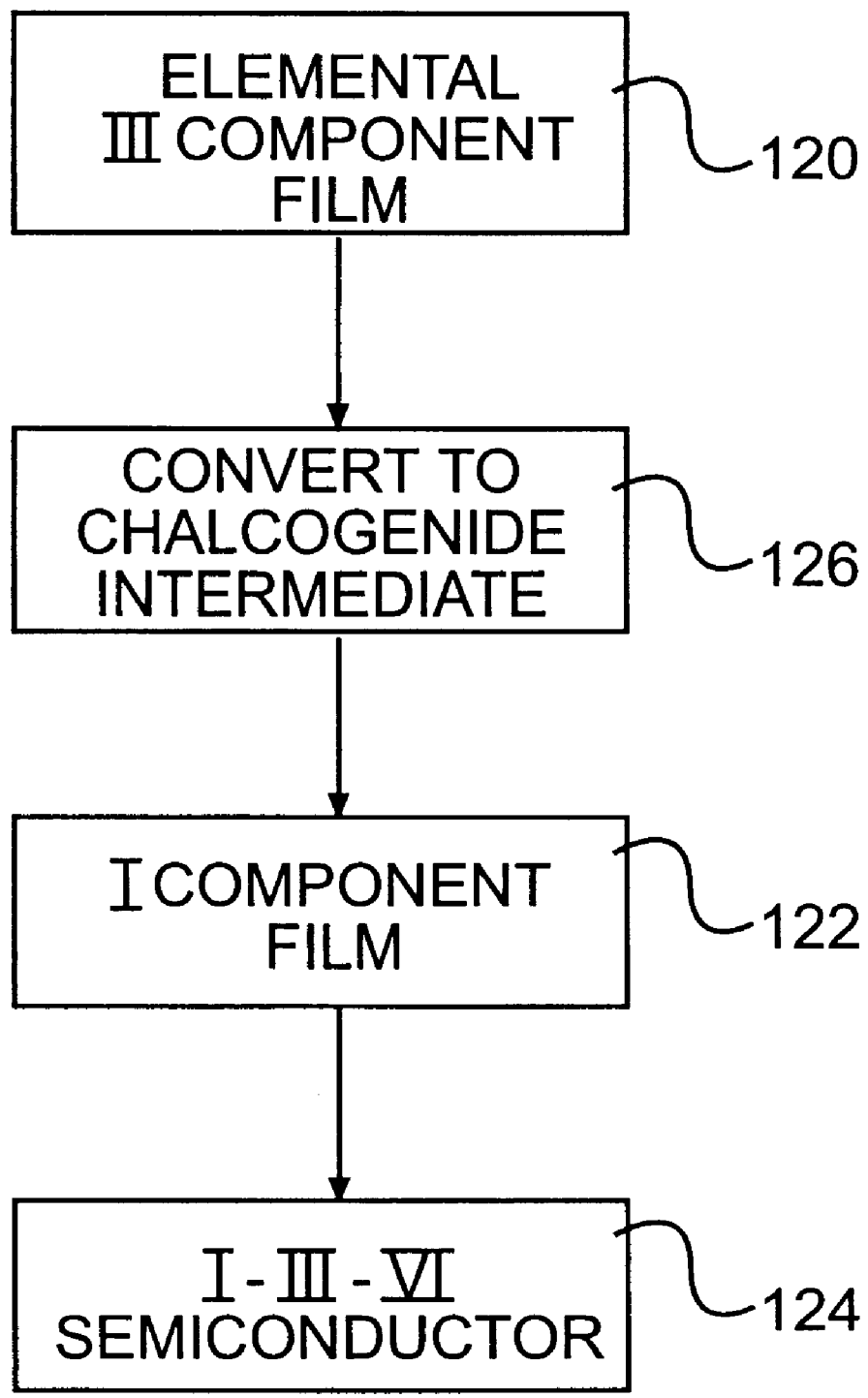
FIG. 3 is a process flow diagram showing generalized steps for another embodiment of the method of the present invention.

As seen in FIG. 3, an additional step 126 is shown as occurring between formation of the precursor film of the elemental III component (general step 120) and formation of the precursor film including the I component (general step 122). During the step 126, at least a portion of the III component in the elemental III component precursor film is converted from elemental form to compound form, in the form of a chalcogenide intermediate.

The conversion of the III component from elemental form to compound form in the chalcogenide intermediate may be effectively accomplished by reacting the III component with a chalcogen during a heat treatment. The chalcogen may be supplied during the heat treatment, for example, in the form of a vapor phase VI component and/or in the form of a film of the VI component deposited adjacent to the elemental III component film prior to or during the heat treatment. As used herein, the term chalcogen and VI component are synonymous and a chalcogenide refers to a compound including one or more metal component and one or more chalcogen, or VI component. The chalcogenide intermediate compound is often a binary compound, but in some instances may be a mixed metal chalcogenide and/or may include more than one chalcogen. The general step 124, as shown in FIGS. 2 and 3, may involve any procedure to produce the I–III–VI semiconductor material. Preferably, however, the general step 124 includes at least a final heat treatment in the presence of a VI component in which the I–III–VI semiconductor material is formed. During the final heat treatment the VI component may be supplied, for example, in the form of a vapor phase VI component and/or in the form of a precursor film of the VI component deposited adjacent the elemental I component film prior to or during the final heat treatment. Furthermore, it should be recognized that the use of the term "final heat treatment," as used herein, does not mean that further heat treatments may not, within the scope of the present invention, follow. Rather the term is used to indicate a last heat treatment in a specified sequence of steps during a process, and does not mean that the process has necessarily been completed or that the process does not include additional steps. Even after the final heat treatment, additional processing may be desirable to further modify properties of the I–III–VI semiconductor material. Likewise, the term "initial heat treatment" indicates a first heat treatment in a specified sequence of steps.

With the method in the present invention, as shown generally in FIG. 3, it is preferred that the method be conducted substantially in the absence of a I component until after the elemental III component has been converted to the chalcogenide intermediate. This sequence appears to be important for both good adhesion and for attaining a relatively high efficiency in photovoltaic cells.

In addition to an initial heat treatment to convert the III component from elemental form to the compound form in the chalcogenide intermediate compound and the final heat treatment to form the final I–III–VI semiconductor material, the method may also include one or more intermediate heat treatments. In one embodiment, a heat treatment step may follow each deposition of a III component and each deposition of a I component.

Furthermore, the general method as described in FIGS. 2 and 3 typically includes the formation of at least three precursor films, one including a III component in elemental form, one including an elemental I component in elemental form, and one including a VI component in elemental form. The method may, however, involve formation of more than one precursor film of a I component, a III component and/or a VI component. Also, when there are multiple elemental precursor films for any one of the I component, the III component or the VI component, it is not necessary that the same element be used for the component in each of the multiple films. For example, the method may include formation of one precursor film of elemental indium as one III component and another precursor film of elemental gallium as another III component. Likewise, the method could include formation of one precursor film including elemental selenium as one VI component and another precursor film of elemental sulphur as a second VI component. As will be appreciated, a large number of combinations are possible.

Figure 4:
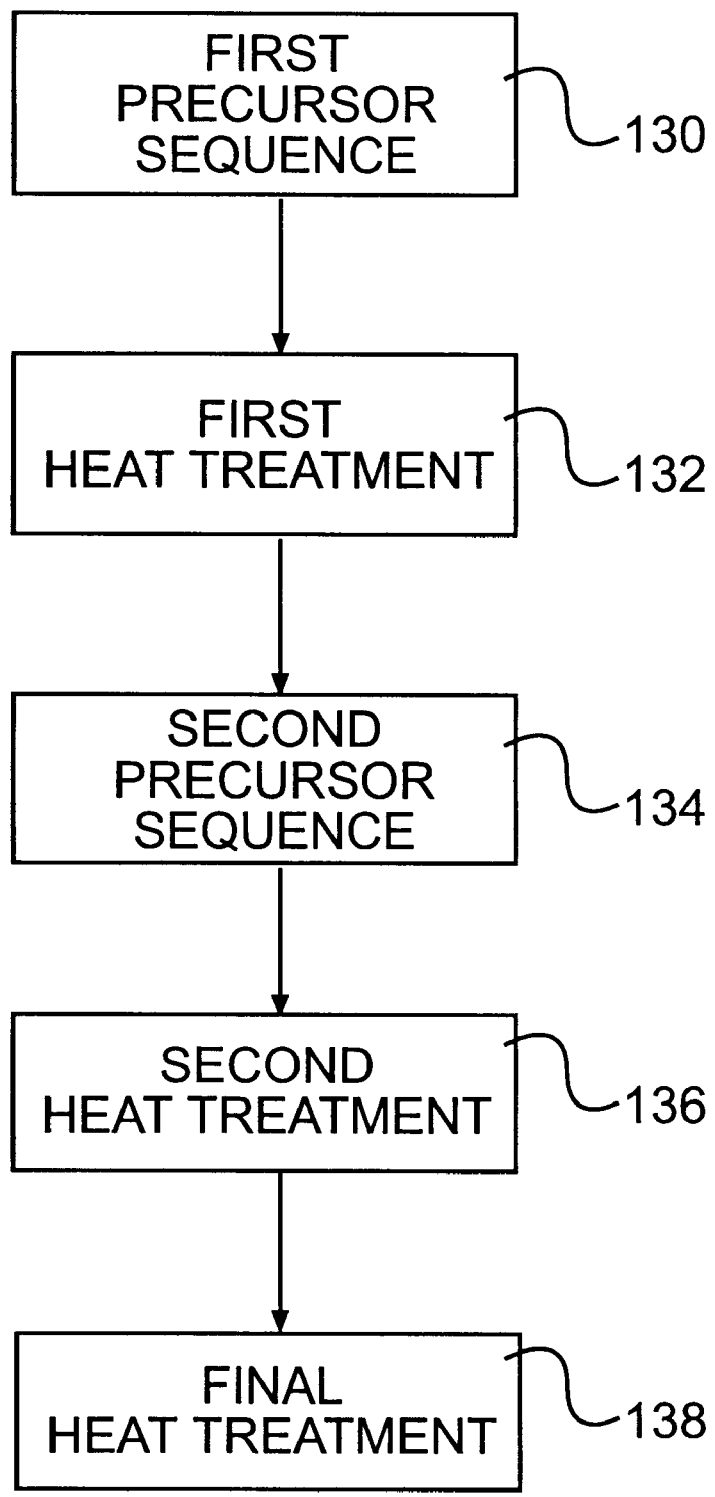
FIG. 4 is a process flow diagram for one embodiment of the method of the present invention including deposition of multiple sequences of precursor films and multiple heat treatment steps.

Referring now to FIG. 4, a process flow diagram is shown for a more specific sequence of steps for one embodiment of the method of the present invention. The embodiment shown in FIG. 4 will be described with reference to manufacture of a CIS layer, but it should be recognized that general principles discussed with respect to CIS apply equally to manufacture of other I–III–VI semiconductor materials according to the present invention. When making CIS according to the process embodiment as shown in FIG. 3, a first step 130 involves forming a first precursor film sequence on a substrate. The substrate typically includes a base substrate, such as a sheet of glass or a flexible film, precoated with a back contact layer, such as of molybdenum. The first precursor film sequence includes at least one film of an elemental III component, in this case elemental indium, and preferably also at least one film of an elemental VI component, in this case elemental selenium. In a second step 132 the first precursor film sequence is subjected to a first heat treatment. During the first heat treatment, a chalcogenide compound is typically formed, preferably a III–VI compound such as $In_xSe_y$, from at least a portion of the indium and selenium in the first precursor film sequence. For example, the $In_xSe_y$ could include $In_2Se_3$. The temperature during the first heat treatment should be high enough to avoid excessive formation of undesirable selenides, such as $In_4Se_3$ and $In_6Se_7$. Also, as with all of the heat treatments with the present invention, the rate at which the temperature is ramped up should be slow enough to avoid excessive losses of the III component and disruptions of the morphology (e.g., blistering) of the films. Ramp rates of slower than about 50° C. per minute are typically sufficient. During the first heat treatment, the temperature is ramped slowly to a maximum elevated temperature of typically greater than about 300° C., preferably in a range of from about 350° C. to about 400° C. and more preferably at about 375° C., and the first precursor film sequence is then soaked at approximately the maximum temperature for a sufficient time to accomplish the desired reaction. A soak time of about 5–10 minutes is typically adequate. During the first heat treatment, an atmosphere including a vapor phase VI component, in this case vapor phase selenium, may be used to help ensure adequate reaction to form the chalcogenide. The VI component vapor may be used instead of or in addition to a previously deposited film of the elemental VI component.

In a third step 134, a second precursor film sequence is formed to overlie at least a portion, and preferably substantially all, of the area on the substrate covered by the heat treated first precursor film sequence. The second precursor film sequence includes at least a precursor film including a I component, in this case copper. The precursor film preferably is a film of an elemental I component, in this case elemental copper. Optionally, the second sequence of films may include additional films, as discussed below.

In a fourth step 136, the second precursor film sequence is subjected to a second heat treatment, which is preferably conducted in a vacuum environment. During the second heat treatment, a relatively mild heat treatment may be used, during which at least a portion of the copper may diffuse into the indium-containing layer below. This relatively mild heat treatment is preferably conducted in a vacuum environment. The mild heat treatment is typically conducted at a temperature of higher than about 100° C., and preferably at a temperature of higher than about 120° C.

The fifth step 138, involves a final heat treatment to form the I–III–VI semiconductor material. The final heat treatment may be performed with or without prior formation of a finish layer. When a finish layer is deposited prior to the final heat treatment, it would typically include a film of an elemental VI component, in this case selenium, and, optionally, one or more other films. During the final heat treatment, the temperature is slowly ramped up to a maximum elevated temperature of typically greater than about 400° C., preferably in a range of from about 400° C. to about 600° C., and soaked for a time sufficient to assure formation of the desired I–III–VI semiconductor material. A soak time of about 15–60 minutes is typically sufficient. To some degree, higher temperatures are generally preferred to make semiconductors exhibiting higher efficiencies in photovoltaic cells. The maximum temperature during the final heat treatment should, however, be low enough so that damage to or deformation of the base substrate does not occur. For example, when using soda lime glass as a base substrate, the maximum temperature should be kept below the temperature at which the glass would begin to soften, which is typically around 550° C. For flexible polyimide films, the temperature should be kept below a temperature at which the polyimide begins to decompose, which is often around 450° C. Also, in a preferred embodiment, the final heat treatment is preferably performed in an atmosphere including a overpressure of a VI component vapor, in this case selenium vapor. Use of the selenium vapor helps to ensure formation of the I–III–VI semiconductor material. Another benefit of using a selenium vapor overpressure is to reduce vaporization losses of other components, such as indium, during the final heat treatment.

A significant advantage of the process embodiments as described with reference to FIGS. 2–4 is that all of the components may be separately deposited as precursor films in elemental form. Also, with the present invention, the component deposition steps are substantially separate from reaction steps to form the semiconductor material. The method is, therefore, amenable to the use of desirable deposition techniques (e.g., low temperature deposition) and to significantly simplified process control. Deposition of the precursor films may be accomplished by relatively uncomplicated techniques for elemental components. Deposition of the elemental I and III precursor films is preferably via sputtering, due to the commercially proven nature of sputtering as a deposition technique for large-area films in the window glass industry. Preferred techniques for depositing the elemental VI component films are sputtering and condensation from a thermally evaporated vapor. A preferred sputtering technique is magnetron sputtering. Although deposition by sputtering is preferred, other deposition techniques could also be used, such as, for example, vacuum evaporation and electrodeposition.

Furthermore, there is a significant degree of flexibility in the method of the present invention for different combinations of precursor films and in varying sequences within the parameters of the method of the present invention. For example, the first precursor film sequence for making CIS could, for example, include a first film of elemental selenium, a second film of elemental indium and a third film of elemental selenium. Other alternatives for the first precursor film sequence include a first film of elemental selenium and second film of elemental indium, or a first film of elemental indium and a second film of elemental selenium. Likewise, the second precursor film sequence could include a variety of films, in addition to the film with the I component, in a variety of sequences. In one embodiment, the second precursor film sequence includes only a single film, which would preferably be a film of the elemental I component, copper in the case of CIS. Alternatively, for example, the second precursor film sequence could also include a film of an elemental VI component, such as selenium in the case of CIS, which could be deposited before or after the film of the elemental I component. Similarly, there is flexibility in the finish layer to vary the number of films and film sequences. In addition to a film of elemental VI component, the finish layer could include, for example, a film of an elemental III component, such as elemental indium in the case of CIS, which would preferably be deposited prior to the film of the elemental VI component.

As will be appreciated, the particular arrangement and sequencing of precursor films in the first precursor film sequence, the second precursor film sequence and the finish layer can be manipulated to vary the properties of the ultimate I–III–VI semiconductor material. Some parameters that may be varied include the order in which certain films are sequenced, which films are included in which sequence, and the thickness of the various films. When making CIS, it is typically preferred that the overall ratio of copper to indium be slightly less than 1. Within this constraint, however, it is possible to distribute the copper and indium in a fashion to provide variations across the thickness of the ultimate semiconductor layer. For example, by including a film of indium in the finish layer, it is possible to produce a semiconductor layer that is somewhat rich in copper near the bottom of the film (i.e., adjacent the back contact) and somewhat deficient in copper near the top of the film (i.e., adjacent the heterojunction in a photovoltaic cell). This variation may be desirable for good electrical contact with the back contact and also for good current generation in the vicinity of the heterojunction.

Also, within the preferred parameters that a film of a III component in elemental form must be deposited prior to a film including the I component, and that the III component preferably be converted to a chalcogenide compound prior to deposition of the I component, there is significant flexibility in the method of the present invention to accommodate a variety of processing alternatives. For example, it is possible that the second heat treatment could be eliminated from the embodiment shown in FIG. 4. This situation is shown in the process flow diagram of FIG. 5.

In all cases, a preferred embodiment for the final heat treatment is to perform the final heat treatment in an atmosphere including an overpressure of a VI component in vapor form. When manufacturing CIS, an overpressure of selenium vapor would be used, as previously noted. Including an overpressure of the VI component prevents excessive vaporization of other components and helps to convert the components to the I–III–VI semiconductor material.

Figure 5:
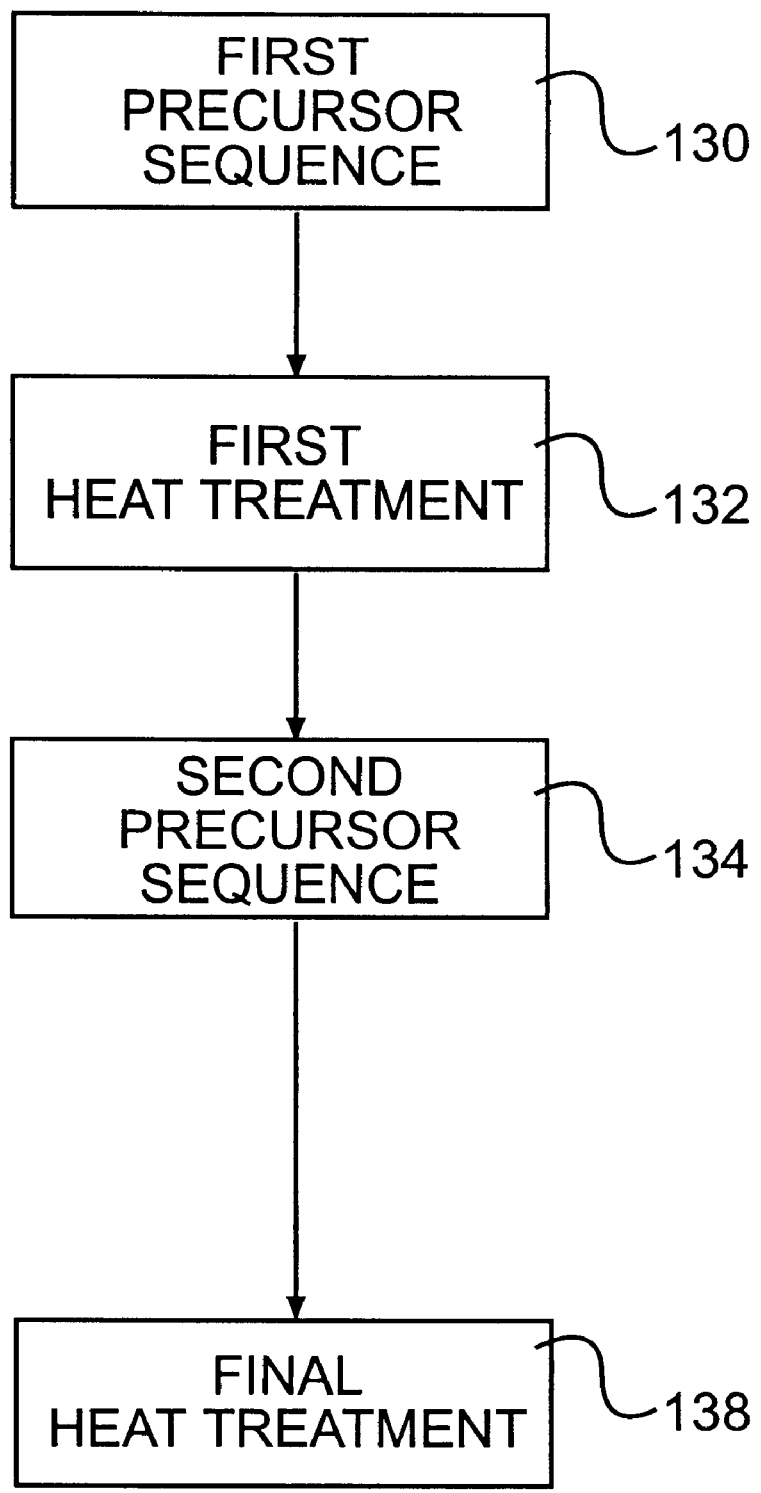
FIG. 5 shows a process flow diagram of one embodiment of the method of the present invention involving deposition of multiple sequences of precursor films and multiple heat treatment steps.

The embodiments described with reference to FIGS. 4 and 5 are easily adaptable to the manufacture of I–III–VI semiconductor materials other than CIS. For example, with reference to FIGS. 4 and 5, when making CIGS, one or more films of gallium could be incorporated in the first precursor film sequence and/or the finish layer, if one is used. For example, the first precursor film sequence could include a film of elemental gallium, a film of elemental indium and one or more films of elemental selenium. The films could be arranged in any convenient sequence. It may be preferred, however, to provide a layer of elemental gallium first, because it appears that gallium promotes enhanced adhesion to a molybdenum back contact. During the first heat treatment, the gallium would then preferably convert from elemental form to the form of a chalcogenide compound. Such a compound could be $Ga_xSe_y$, or could be a mixed metal chalcogenide with indium (i.e., $In_xGa_{1-x}Se_y$).

Likewise, when making CIGSS, one or more films of gallium could be included in the first precursor film sequence and/or the finish layer, and one or more layers of sulfur could be included in one or more of the film sequences.

Figure 6:
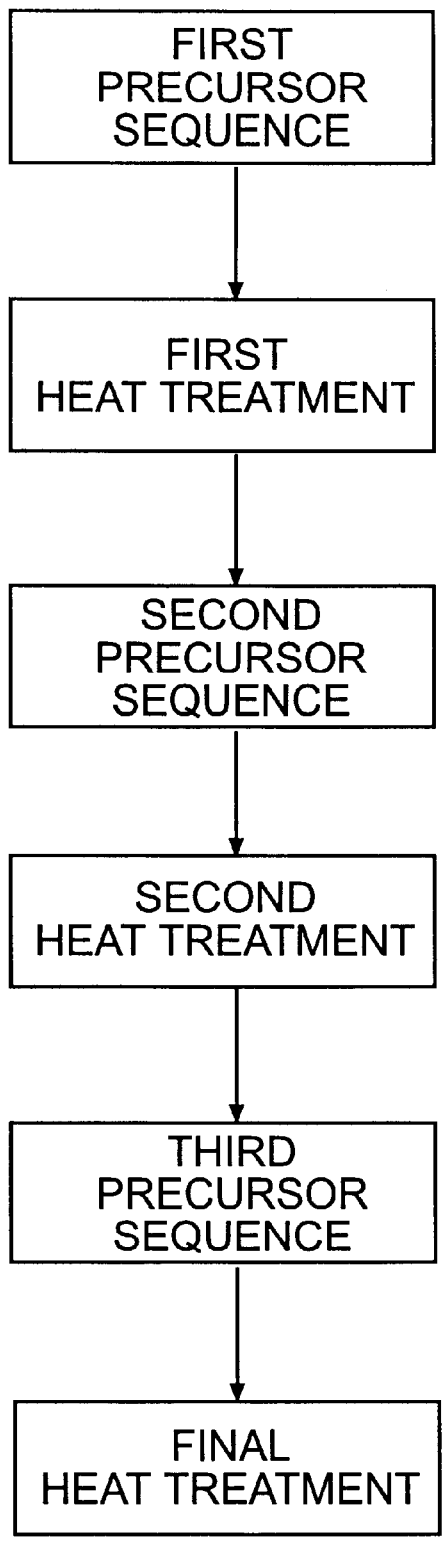
FIG. 6 shows another embodiment of the method of the present invention including deposition of multiple sequences of precursor films and multiple heat treatment steps.

Also, when the I–III–VI semiconductor material includes multiple different III components, such as gallium and indium, the different III components could be processed in separate film deposition sequences and with separate heat treatments. Such an embodiment is shown in FIG. 6, which will be described with respect to manufacture of CIGS. In the embodiment shown in FIG. 6, a first precursor film sequence is formed as described with respect to FIG. 4, followed by a first heat treatment, also as described in FIG. 4. After the first heat treatment, a second precursor film sequence is formed. The second precursor film sequence includes a film of elemental gallium and, optionally, also one or more films of elemental selenium. In a second heat treatment, the gallium is converted from elemental form to a compound form in a chalcogenide compound. Following the second heat treatment, a third precursor film sequence is formed, which includes at least a film of elemental copper, in a manner as previously described. A finish layer is then formed, if desired, followed by a final heat treatment, in a manner as previously discussed. Alternatively, the first precursor film sequence could include the gallium and the second precursor film sequence could include the indium. In further alternatives, the gallium film could be included in the third precursor film sequence along with the copper film or in a separate film sequence following the second heat treatment.

In one aspect of the present invention, when gallium is used as a III component, such as for example as discussed above, it is preferred to deposit the gallium in elemental form by sputtering. This is significant because traditional thought has been that gallium is not suitable for deposition by sputtering due to its low melting point. With the present invention, however, it has been found that gallium may successfully be deposited by sputtering. According to the present invention, sputtering deposition of gallium may be accomplished with aggressive cooling of a solid gallium target during deposition. The cooling may be accomplished by circulating a cooling liquid, typically water, through interior channels inside the target to cool the target during sputtering. Such cooling of targets is generally known for other target materials, but it has been found that for gallium, the rate of cooling must typically be more aggressive than is the traditional practice with other materials. For example, either a very high flow rate of cooling liquid or a very low temperature cooling fluid could be used to accomplish the aggressive cooling. Cooling water at about 15° C. with a very high flow rate is typically adequate.

Furthermore, although the present invention has been described with respect to preferred embodiments involving deposition of a III component in elemental form, in one embodiment, the III component may be initially deposited in the form of a I–III–VI compound prior to deposition of a I component. In this case, the initial, or first heat treatment, as described in FIGS. 2–6, would not be required, as the III component would already be in the form of a chalcogenide compound. This embodiment, although generally not preferred, has significant potential for application in the manufacture of I–III–VI semiconductor materials including indium, and particularly for manufacture of CIS, CIGS, CIGSS, and the like. For example, a film of $In_xSe_y$ could initially be deposited, followed by a film of elemental copper, processing from that point could be as previously described. Also, the $In_xSe_y$ would preferably be deposited by a relatively uncomplicated deposition technique. A preferred deposition technique would be sputtering from an $In_xSe_y$ target, such as a target of $In_2Se_3$.

Also, although the invention is described with primary reference to use of the I–III–VI semiconductor in photovoltaic devices, the invention is not so limited. The I–III–VI materials made according to the present invention could be used for any appropriate application with which the I–III–VI semiconductor material is compatible, for example in making thermoelectric devices. Additionally, it is a stated objective of the present invention to avoid the use of hydrogen selenide. It should be recognized, however, that hydrogen selenide, or other hydrogen chalcogenide compounds or other reactive chalcogen-containing compounds, may, nevertheless, be used as a source of a VI component within various embodiments of the present invention when it is desired to provide the VI component in a gaseous or vaporous form.

EXAMPLE

This example demonstrates manufacture of a CIGS layer and a photovoltaic device incorporating the layer.

A base substrate of soda lime glass is provided having a film of molybdenum of approximately 1 micron thick. Over the molybdenum film is deposited a condensed film of elemental selenium (approximately 1700 angstroms thick) from thermal evaporation of a selenium source, followed by a film of elemental indium (approximately 4877 angstroms thick) deposited by magnetron sputtering, followed by another condensed film of elemental selenium from thermal evaporation of a selenium source. These films are then subjected to a heat treatment in the presence of a 60 angstroms per second background of selenium at a temperature of 375° C. for 20 minutes. The films are then cooled for 15 minutes in a vacuum. Following cooling, a film of elemental copper (approximately 2372 angstroms thick) is then deposited by magnetron sputtering. The copper film is then subjected to a heat treatment at a temperature of 230° C. for 3 minutes in a vacuum. The copper film is then cooled in a vacuum. Following cooling, a film of elemental gallium (approximately 400 angstroms thick) is deposited by thermal evaporation, with aggressive cooling of the gallium target during deposition, followed by a condensed film of elemental selenium (approximately 3000 angstroms thick) by magnetron sputtering. The entire stack is then subjected to a final heat treatment at a temperature of 550° C. for one hour. The stack is then cooled and a photovoltaic cell is finished by deposition, in sequence, of films of n-type cadmium sulfide (approximately 500 angstroms thick), resistive intrinsic zinc oxide (approximately 500 angstroms thick), conductive doped zinc oxide, indium tin oxide (approximately 0.4 micron thick), and finally, magnesium fluoride (approximately 1300 angstroms thick) as an antireflective coating.

Preferred embodiments for the process of the present invention, and semiconductor materials and photovoltaic cells manufacturable thereby, have been described herein. It should be recognized, however, that the present invention is not so limited. For example, any suitable combination of I, III and VI elements may be used to manufacture the semiconductor materials. Also, any sufficient supporting base substrate may be used, and the I–III–VI semiconductor material may be incorporated into photovoltaic cells of any design compatible with the I–III–VI semiconductor material. Furthermore, the components may be deposited using any technique to prepare the desired precursor films. Moreover, sequences of film deposition, the number of heat treatments applied, and the manner of component deposition are intended to be varied to fit the circumstances of particular applications.

Furthermore, the foregoing description of the invention has been presented for purposes of illustration and description with reference to certain embodiments. The description is not intended to be limited to the specific embodiments described, but includes variations and modifications commensurate with the above teachings, and with the skill and knowledge in the relevant art area within the scope of the present invention. The embodiments described hereinabove are intended to explain the best mode known of practicing the invention and to enable others skilled in the art to utilize the invention in various embodiments and with various modifications and adaptations required by the particular circumstances. It is intended that the appended claims be construed to include alternative embodiments to the extent permitted by the prior art.

What is claimed is:

1. A method for making a layer of a I–III–VI semiconductor material in which I and III components are separately deposited for subsequent formation of the I–III–VI semiconductor material, the method comprising:

forming a film, supported by a base substrate, including a III component in elemental form;

in the presence of a VI component, converting at least a portion of the III component of the film from elemental form to a compound form in a III–VI compound;

after the step of converting, forming, in the presence of at least one I component, the layer of I–III–VI semiconductor material supported on the base substrate, the I–III–VI semiconductor material including at least a portion of the III component and the VI component from the III–VI compound.

2. The method of claim 1, wherein:

the film consists essentially of only the III component in elemental form.

3. The method of claim 1, wherein:

the step of converting is performed substantially in the absence of the I component.

4. The method of claim 1, wherein:

the film is a first film and the method further comprises, after the step of forming the first film, forming a second film, supported by the base substrate and overlying at least a portion of the first film, the second film including the VI component in an elemental form.

5. The method of claim 4, wherein:

the step of converting includes heat treatment at an elevated temperature of the first film and the second film to form the III–IV compound.

6. The method of claim 5, wherein:

the elevated temperature is higher than about 300° C.

7. The method of claim 1, wherein:

the method further comprises, after the step of converting and prior to the step of forming the I–III–VI semiconductor material, forming a film, supported on the base substrate, including the I component in an elemental form and overlying at least a portion of the III–VI compound.

8. The method of claim 7, wherein:

the method further comprises, after the step of forming the film including the I component and prior to the step of forming the I–III–VI semiconductor material, converting at least a portion of the I component from elemental form to a compound form in a I–VI compound.

9. The method of claim 8, wherein:

the method further comprises, after the step of converting at least a portion of the III component from elemental to compound form and prior to the step of converting the I component from elemental form to compound form, forming a film, supported by the base substrate, including the VI component in elemental form, the film including the VI component being adjacent the film including the I component immediately prior to the step of converting at least a portion of then I component from element to compound form.

10. The method of claim 7, wherein:

the step of forming the I–III–VI semiconductor material comprises subjecting materials supported by the base substrate, including the III component and the I component, to a heat treatment at elevated temperature.

11. The method of claim 10, wherein:

the elevated temperature is higher than about 400° C.

12. The method of claim 10, wherein:

the heat treatment is conducted in at atmosphere including an overpressure of the VI component in vapor form.

13. The method of claim 12, wherein:

the VI component comprises selenium.

14. The method of claim 10, wherein:

the method further comprises, after the step of forming the film including the I component and prior to the heat treatment, forming a film, supported by the base substrate, including the VI component.

15. The method of claim 10, wherein:

the I component comprises copper, the III component comprises indium and the VI component comprises selenium.

16. The method of claim 1, wherein:

the film is a first film and the III component is a first III component; and and the method further comprises, after the step of converting and before the step of forming the I–III–VI semiconductor material, forming a second film, supported by the base substrate and overlying at least a portion of the III–VI compound, including a second III component in an elemental form.

17. The method of claim 16, wherein:

the III–VI compound is a first III–VI compound and the method further comprises, after the step of forming the second film and prior to the step of forming the I–III–VI semiconductor material, converting at least a portion of the second III component from elemental form to a compound form in a second III–VI compound.

18. The method of claim 16, wherein:

one of the first III component and the second III component is gallium and the other is indium.

19. The method of claim 1, wherein:

the method further comprises incorporating the layer including the I–III–VI semiconductor material into a photovoltaic cell supported on the base substrate.

20. A photovoltaic cell made according to the method of claim 19.

21. The method of claim 19, wherein:

the photovoltaic cell includes a molybdenum film located between the base substrate and the semiconductor layer.

22. The method of claim 19, wherein:

the I–III–VI semiconductor material is a first semiconductor and the method further comprises, after the step of forming the I–III–VI semiconductor material, forming a layer of a second semiconductor material forming a junction with the layer of the first semiconductor material.

23. The method of claim 22, wherein:

the first semiconductor material is a p-type.

24. The method of claim 23, wherein:

the second semiconductor material is n-type.

25. The method of claim 1, wherein:

the III component includes at least one of aluminum, gallium and indium.

26. The method of claim 1, wherein:
the III component includes at least indium.

27. The method of claim 1, wherein:
the I component includes at least copper.

28. The method of claim 1, wherein:
the VI component includes at least one of sulfur, selenium and tellurium.

29. The method of claim 1, wherein:
the VI component includes at least selenium.

30. The method of claim 1, wherein:
the I–III–VI semiconductor material is copper indium diselenide ($CuInSe_2$).

31. The method of claim 1, wherein:
the I–III–VI semiconductor material is copper indium gallium selenide ($CuIn_xGa_{1-x}Se_2$).

32. A layer of the I–III–VI semiconductor material made according to the method of claim 1.

33. A method for making a layer of I–III–VI semiconductor material including at least one I component selected from the group consisting of copper and silver, at least one III component selected from the group consisting of aluminum, gallium and indium and at least one VI component selected from the group consisting of sulfur, selenium and tellurium, the method comprising:
separately forming at least three precursor films in a predetermined sequence, with each of the at least three precursor films, as formed, being supported by a base substrate, a first precursor film including at least a first I component in elemental form, a second precursor film including at least a first III component in elemental form and a third precursor film including at least a first VI component in elemental form;
forming the I–III–VI semiconductor material to include at least a portion of the first I component, the first III component and the first VI component from the first, second and third precursor films;
wherein, the second precursor film and the third precursor film are formed prior to forming of the first precursor film.

34. The method of claim 33, wherein:
the step of forming the I–III–VI semiconductor material comprises a heat treatment of the first I component, the first III component and the first VI component as supported by the base substrate.

35. The method of claim 33, wherein:
the method comprises a plurality of heat treatments, with at least a first heat treatment occurring prior to forming the first precursor film and at least a second heat treatment occurring after forming the first precursor film.

36. The method of claim 33, wherein:
after forming the second and third precursor films and prior to forming the first precursor film, the method further comprises heat treatment of the second and third films at an elevated temperature.

37. The method of claim 36, wherein:
during the heat treatment, the elevated temperature reaches a temperature that is higher than about 300° C.

38. The method of claim 36, wherein:
during the heat treatment, the first III component and the first VI component react to form a III–VI compound.

39. The method of claim 38, wherein:
the III–VI compound is $In_xSe_y$.

40. The method of claim 33, wherein:
the I–III–VI semiconductor material is copper indium diselenide.

41. The method of claim 36, wherein:
the heat treatment is a first heat treatment and the method further comprises at least a second heat treatment occurring during the step of forming the I–III–VI semiconductor material.

42. The method of claim 41, wherein:
the third heat treatment is conducted in an atmosphere including an overpressure of a vaporous VI component.

43. The method of claim 42, wherein:
the vaporous VI component and the first VI component are the same VI element.

44. The method of claim 43, wherein:
the vaporous VI component is selenium vapor.

45. The method of claim 41, wherein:
after formation of the first precursor film and prior to the third heat treatment, the method further comprises forming a finish layer including at least a film of a second VI component.

46. The method of claim 45, wherein:
the second VI component and the first VI component are the same VI element.

47. The method of claim 45, wherein:
the finish layer includes a film including a second III component in elemental form.

48. The method of claim 47, wherein:
the second III component and the first III component are the same III element.

49. The method of claim 47, wherein:
after the first heat treatment, the method comprises forming at least a fourth precursor film including a second III component in elemental form.

50. The method of claim 49, wherein:
the second III component and the first III component are different III elements.

51. The method of claim 50, wherein:
one of the first III component and the second III component is indium and the other is gallium.

52. The method of claim 33, wherein:
the I–III–VI semiconductor material is a copper indium gallium diselenide.

53. The method of claim 33, wherein:
the steps of forming each of the first, second and third precursor films includes deposition from an elemental source.

54. The method of claim 33, wherein:
the deposition of at least one of the first, second and third precursor films is via magnetron sputtering.

55. A layer of the I–III–VI semiconductor material made according to the method of claim 33.

56. A photovoltaic cell incorporating the I–III–VI semiconductor material made according to the method of claim 33.

* * * * *